US009583387B2

(12) United States Patent
Mei et al.

(10) Patent No.: US 9,583,387 B2
(45) Date of Patent: Feb. 28, 2017

(54) MULTILEVEL MASK CIRCUIT FABRICATION AND MULTILAYER CIRCUIT

(71) Applicant: Applied Materials, Inc., Santa Clara, CA (US)

(72) Inventors: Ping Mei, Palo Alto, CA (US); Carl A. Taussig, Palo Alto, CA (US); Marcia Almanza-Workman, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/787,223

(22) PCT Filed: Apr. 30, 2013

(86) PCT No.: PCT/US2013/038763
§ 371 (c)(1),
(2) Date: Oct. 26, 2015

(87) PCT Pub. No.: WO2014/178835
PCT Pub. Date: Nov. 6, 2014

(65) Prior Publication Data
US 2016/0111328 A1    Apr. 21, 2016

(51) Int. Cl.
*H01L 21/44* (2006.01)
*H01L 21/768* (2006.01)
(Continued)

(52) U.S. Cl.
CPC ........ *H01L 21/76886* (2013.01); *G06F 3/044* (2013.01); *H01L 21/32139* (2013.01); *H01L 23/4821* (2013.01); *H01L 23/528* (2013.01); *G06F 2203/04103* (2013.01); *G06F 2203/04111* (2013.01); *H01L 2924/0002* (2013.01)

(58) Field of Classification Search
CPC . H01L 21/027; H01L 21/32; H01L 21/32139; H01L 21/76886; H01L 21/528
See application file for complete search history.

(56) References Cited

U.S. PATENT DOCUMENTS

2003/0170937 A1    9/2003   Eccleston
2006/0166437 A1    7/2006   Korber
(Continued)

OTHER PUBLICATIONS

International Search Report and Written Opinion dated Jan. 23, 2014 for Application No. PCT/US2013/038763.

*Primary Examiner* — A. Sefer
(74) *Attorney, Agent, or Firm* — Patterson + Sheridan, LLP

(57) ABSTRACT

Circuit fabrication uses a multilevel mask to pattern a first conductor layer of a multilayer circuit. The first conductor patterning is to provide electrical isolation between the first conductor layer and a second conductor layer that one of overlies the multilevel mask and underlies the multilevel mask. With the second conductor layer overlying the multilevel mask, the electrical isolation is provided by undercutting the multilevel mask. Alternatively, with the second conductor underlying the multilevel mask, the first conductor includes a bridged gapped conductor and the electrical isolation may be provided by both the bridged gapped conductor and an insulating layer between the second conductor layer and the first conductor layer.

20 Claims, 10 Drawing Sheets

(51) Int. Cl.
*G06F 3/044* (2006.01)
*H01L 23/482* (2006.01)
*H01L 21/3213* (2006.01)
*H01L 23/528* (2006.01)

(56) References Cited

U.S. PATENT DOCUMENTS

| | | | |
|---|---|---|---|
| 2011/0134050 A1 | 6/2011 | Harley | |
| 2011/0205168 A1* | 8/2011 | Jun | G06F 3/044 345/173 |
| 2011/0207055 A1* | 8/2011 | Jun | G06F 3/044 430/313 |
| 2011/0281379 A1 | 11/2011 | Yang et al. | |
| 2013/0100145 A1 | 4/2013 | Zhong et al. | |
| 2014/0118292 A1* | 5/2014 | Kim | G06F 3/044 345/174 |

* cited by examiner

MULTILEVEL MASK CIRCUIT FABRICATION AND MULTILAYER CIRCUIT

CROSS-REFERENCE TO RELATED APPLICATIONS

N/A

STATEMENT REGARDING FEDERALLY SPONSORED RESEARCH OR DEVELOPMENT

N/A

BACKGROUND

Multilayer integrated circuits are increasingly important in the production and economic viability of a wide variety of electronic devices. For example, multilayer circuits such as, but not limited to, active matrix backplanes and projective capacitive touch sensors employ crossovers or crossover bridges to connect one portion of a circuit (e.g., a first capacitive electrode) to another portion of the multilayer circuit (e.g., a second capacitive electrode) while providing electrical isolation with respect to other portions of the multilayer circuit. The crossovers are often provided by a separate layer that is separated from an underlying portion of the multilayer circuit by an insulator. In various examples, the insulator may be air or an insulating (e.g., dielectric) material.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1:
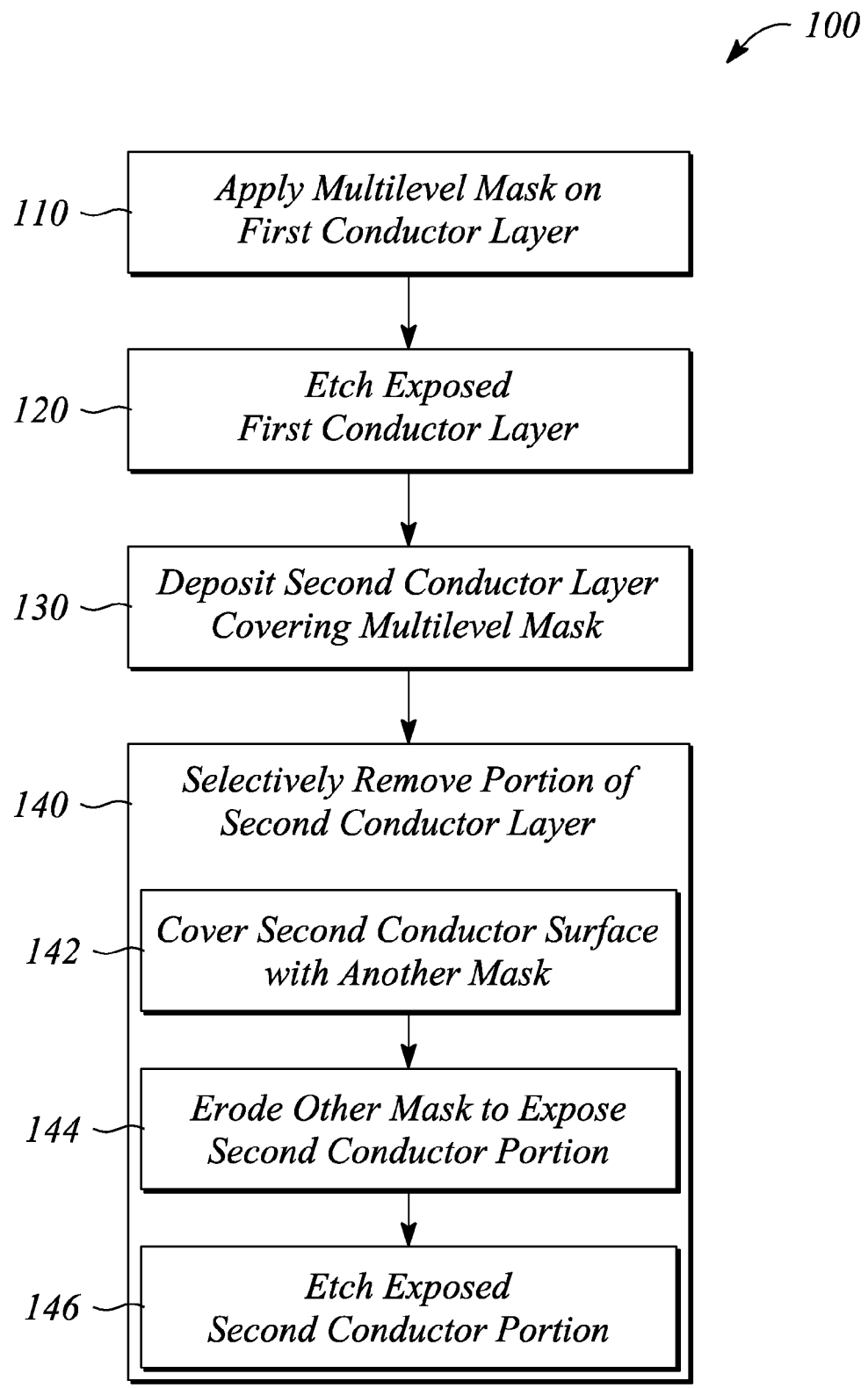
FIG. 1 illustrates flow chart of a method of multilevel mask circuit fabrication, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide circuit fabrication using multilevel masking. In particular, examples in accordance with the principles described herein provide multilevel mask circuit fabrication to produce multilayer circuits. Examples of the multilevel mask circuit fabrication, described herein, may be used to manufacture a multilayer construct or circuit such as, but not limited to, an active matrix backplane and a touch screen sensor (e.g., a capacitive touch sensor). In various examples, the multilevel mask circuit fabrication may provide a crossover bridge between portions of a circuit where the crossover bridge is electrically isolated from a portion of the circuit passing below the crossover bridge.

In some examples, the multilevel mask circuit fabrication may provide fabrication of one or both of a projective capacitive touch sensor for use in touch screen display and a projective capacitive touch based fingerprint sensor used for various biometric applications. In particular, the multilevel mask circuit fabrication described herein may produce circuits having features that are small enough that the projective capacitive touch sensor used in a touch screen display may also be used as a fingerprint sensor. For example, the fabricated circuit (e.g., the projective capacitive touch sensor) may have dimensions that are smaller, and in some examples much smaller, than is possible with other circuit fabrication methodologies. Circuits having feature sizes less than about five microns and alignment tolerances better than about plus or minus three microns may be achieved, using the multilevel mask circuit fabrication according to the principles described herein, for example. Achieving small dimensions and tight alignment tolerances may be difficult with conventional fabrication methodologies. For example, it is often difficult to align and etch patterns on opposite sides of a substrate often used in a conventional fabrication method for projective capacitive touch sensors. Likewise, alignment from layer to layer can be difficult in conventional multilayer fabrication methods.

Moreover, according to various examples, multilevel mask circuit fabrication does not rely on mutual etch selectivity to define and fabricate a multilayer circuit. In particular, multilayer circuits having two or more conductor layers may be fabricated according to the principles described herein. Unlike conventional circuit fabrication that may employ a multilevel mask, a pattern of a first conductor layer may be achieved that is substantially independent of a pattern of an overlying second conductor layer without requiring that the first and second conductor layers exhibit mutual etch selectivity. For example, each of the first conductor layer and the second conductor layer may comprise the same material.

Herein, 'etching' and 'etch' are defined as the process and the result, respectively, of selective material removal using a mask. In particular, a mask is explicitly employed to define a portion of the material that is selectively removed by etching, as defined and used herein. For example, etching may employ an etchant (e.g., wet etchant or dry etchant) to remove a portion of the material exposed by an opening in an overlying mask through which the etching acts on the material. By contrast, 'eroding' is a substantially non-selective removal of material, by definition and as used herein. In particular, the term 'eroding' is employed herein in conjunction with substantially non-selective removal of material from an entire surface of the material, while the term 'etching' or 'etch' refers specifically to material removal that is limited in scope to a specific region or portion of the surface as defined by an opening in a mask. For example, when a mask is used to limit removal of a portion of a conductor layer, the removal is referred to as 'etching the conductor layer.' Implicit in the use of the mask for etching the first conductor layer is an opening in the mask that exposes a portion of the first conductor layer.

On the other hand, eroding material in a layer or layers (e.g., on a substrate) is not limited to an opening in a mask or more generally to an exposed portion of the material being eroded. Instead, eroding is material removal that generally applies to the entirety of the material (or at least an entire surface of the material). However, while eroding affects or removes material from the entirety of the surface of the material to which eroding is applied, eroding may not remove all of the material (e.g., in a vertical dimension) and further may not apply to other materials on the substrate, as defined herein.

In particular, a material layer may be selectively eroded to remove only a predetermined portion of the material in a vicinity of the surface of the material, where the predetermined portion is characterized by a controlled depth extending vertically into the material. Thus, eroding may be used to remove a predetermined thickness of the material from a surface thereof. Further, as the material is removed by eroding, other exposed materials (e.g., exposed by the eroding) may not be removed by eroding. For example, eroding a mask material may expose a portion of an underlying conductor layer. However, during eroding, the exposed portion of the underlying conductor layer may be substantially unaffected (i.e., not removed) by the eroding.

Herein, a 'multilevel mask' is defined as a lithographic mask used in etching that has more than one mask 'level' or thickness in different regions of the mask. In particular, in a first region of the multilevel mask the mask may have a first thickness, while in a second region the multilevel mask has a second thickness, the second thickness being different (e.g., thicker) than the first thickness. The first thickness may be referred to as a first level and the second thickness may be referred to as a second level, as defined herein. For example, self-aligned imprint lithography (SAIL) generally employs a multilevel mask, as defined and used herein.

According to various examples, the multilevel mask may have two or more levels. In some examples, the mask may also have openings that expose a portion of an underlying material or substrate or underlying layer upon which the mask is situated or applied. The openings may be referred as a zero level, for example, denoting a mask thickness of about zero thickness associated with the openings. In some examples, such as just after the multilevel mask is applied, the openings may include residual mask material. The residual mask material may be removed (e.g., by plasma etching) prior to use of the multilevel mask in etching, according to various examples. In some examples below, eroding may be used to thin the multilevel mask to, for example, take advantage of the multiple levels therein. Examples of multilevel masks are illustrated below.

Herein, 'undercutting' is defined as the removal of a portion of a material layer underlying another material layer without removal of the other material layer. For example, removal of a material in a conductor layer without removal of an overlying mask layer is undercutting, by definition herein. Often, undercutting is performed at a periphery or edge of the overlying material layer. Undercutting may be provided by selective over-etching of the underlying layer, for example. Over-etching may be etching that is performed for a period of time selected to be longer than a period of time used to merely completely remove a portion of the layer (e.g., the portion exposed by the mask). An amount of time of the over-etching may determine a depth or width of the undercutting, according to various examples.

Herein, a 'gapped conductor' and a 'gapped conductor layer' is defined as a conductor or a conductor layer that is divided up in a plurality substantially parallel strips or traces by intervening gaps in the conductor or conductor layer. In some examples, the substantially parallel traces may be piece-wise parallel, while in other examples the substantially parallel traces are parallel along an entire length of the traces. However, in either example, the traces do not extend across the gaps in the gapped conductor or gapped conductor layer, by definition herein.

A 'bridged' gapped conductor and a 'bridged' gapped conductor layer are defined herein respectfully as a gapped conductor and a gapped conductor layer in which bridges (e.g., a conductive path) extend across the gap from one trace to another adjacent trace. In general, the bridges connect adjacent traces at discrete points along the traces, by definition herein. In some examples, the bridges are located periodically along the traces with a predetermined periodicity or spacing between the bridges. In other examples, the bridges are located randomly along the traces (i.e., a spacing between the bridges is substantially random). For simplicity of discussion herein, bridges and bridging of gaps in a bridged gapped conductor as well as in a bridged gapped conductor layer will be generally referred to as 'periodic bridges' and 'periodic bridging', without loss of generality, unless a distinction is necessary for proper understanding.

Further, as used herein, the article 'a' is intended to have its ordinary meaning in the patent arts, namely 'one or more'. For example, 'a layer' means one or more layers and as such, 'the layer' means 'the layer(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount with a range of about 51% to about 100%, for example. Moreover, examples herein are intended to be illustrative only and are presented for discussion purposes and not by way of limitation.

According to various examples of the principles described herein, a method of multilevel mask circuit fabrication is provided. The method of multilevel mask circuit fabrication may be used to produce a multilayer circuit. In particular, the multilayer circuit produced may have electrically isolated crossovers. In various examples, a variety of multilayer circuits may be produced using the method of multilevel mask circuit fabrication described herein including, but not limited to, a projective capacitive touch sensor having electrically isolated crossovers between pairs of electrodes.

In some examples, transparent conductor materials as well as a substantially transparent substrate may be used in conjunction with the method of multilevel mask circuit fabrication facilitating fabrication of a substantially transparent multilayer circuit (e.g., a transparent projective capacitive touch sensor). Transparent multilayer circuits such as the projective capacitive touch sensor may be employed in conjunction with a flat panel display for touch screen based user interface applications, for example. Both transparent as well as substantially non-transparent projective capacitive touch sensors may be used in a variety of other applications including, but not limited to fingerprint sensors and other similar biometric applications.

According to various examples, the method of multilevel mask circuit fabrication comprises patterning a first conductor layer using a multilevel mask. The first conductor may be on a substrate, for example. In some examples, the first conductor layer patterning provides electrical isolation between the first conductor layer and a second conductor layer that is overlying the multilevel mask (i.e., method 100, below). In these examples, electrical isolation is provided by undercutting the multilevel mask during patterning. In other examples, the patterning of the first conductor layer provides electrical isolation between the first conductor layer and a second conductor layer that underlies the multilevel mask (i.e., method 300, below). In these other examples, the first conductor layer comprises a bridged gapped conductor and the electrical isolation is provided by both the bridged gapped conductor and an insulating layer (e.g., a dielectric layer) between the second conductor layer and the first conductor layer.

FIG. 1 illustrates flow chart of a method 100 of multilevel mask circuit fabrication, according to an example consistent with the principles described herein. In particular, the method 100 of multilevel mask circuit fabrication illustrated in FIG. 1 provides patterning of a first conductor layer with the second conductor layer overlying the multilevel mask. Further, the method 100 of multilevel circuit fabrication illustrated in FIG. 1 provides electrical isolation by undercutting the multilevel mask during patterning.

As illustrated, the method 100 of multilevel circuit fabrication comprises applying 110 the multilevel mask on the first conductor layer. In some examples, the first conductor layer may be on a substrate. In some examples, another layer may be between the first conductor layer and a surface of the substrate.

According to various examples, the multilevel mask is applied 110 to a surface (e.g., a top surface) of the first conductor layer. In some examples, the multilevel mask may be applied 110 using imprint lithography (e.g., nanoimprint lithography) or a similar method to form a mask material into the multilevel mask in situ on the first conductor. The mask material may be a material such as, but not limited to, polymethylmethacrylate (PMMA) and a polymer from the Norland optical adhesives (NOA) family manufactured by Norland Products of Cranberry, N.J., into which a pattern of the multilevel mask is imprinted or impressed to form the multilevel mask in situ, for example. In another example, the multilevel mask may be applied 110 on the first conductor layer as a pre-patterned or pre-formed sheet or layer of mask material. For example, the pre-patterned mask material sheet may be produced by a stamping or molding process prior to applying 110 and then glued or otherwise affixed to the surface first conductor layer during applying 110.

According to various examples, the multilevel mask has a plurality of levels. For example, the multilevel mask may have at least two levels in a vertical or z-direction perpendicular to a plane of the multilevel mask. A thinner region of the multilevel mask may represent or correspond to a first level, while a thicker region or portion may represent or correspond to a second level of the two levels, for example. Further, the multilevel mask may include a pattern defined in one or both of an x-direction and a y-direction in much the same manner as a conventional (i.e., single level) photolithographic mask. As such, the multilevel mask may be characterized as a three-dimensional (3-D) mask to distinguish it from two-dimensional (2-D) masks that have only a single layer.

Further, after applying 110 the multilevel mask, a portion of the first conductor layer may be exposed by the multilevel mask, according to various examples. In particular, the multilevel mask may have an opening that exposes the portion of the first conductor layer. In some examples, a residue (e.g., a level zero that is initially thinner than the first level) of the multilevel mask may initially occlude the opening in the mask. The residue may be removed to insure that the exposed portion of the first conductor layer is fully exposed. For example, the residue portion may be removed by subjecting the multilayer mask to plasma etching. Removal of the residue may be performed as part of applying 110, according to some examples.

Figure 2A:
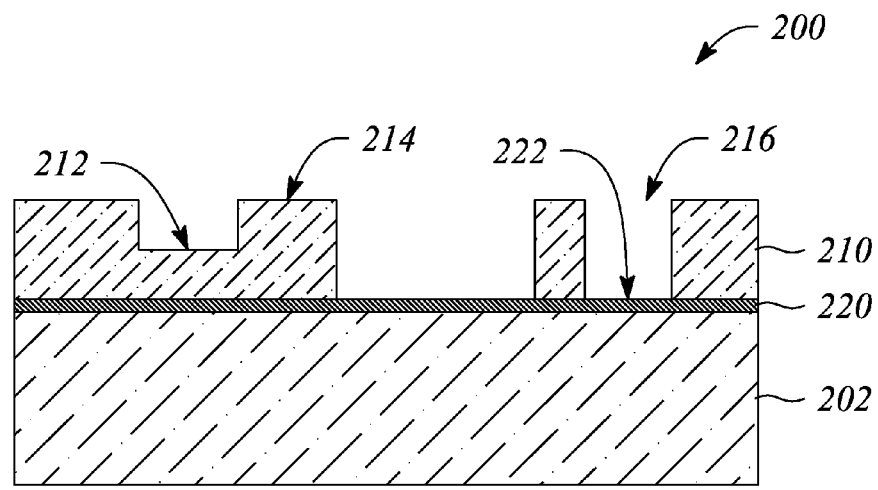
FIG. 2A illustrates a cross sectional view of a multilayer circuit during multilevel mask circuit fabrication, according to an example consistent with the principles described herein.

FIGS. 2A-2G illustrate the fabrication of a multilayer circuit 200 using the method 100 for example. FIG. 2A illustrates a cross sectional view of a multilayer circuit 200 during multilevel mask circuit fabrication 100, according to an example consistent with the principles described herein. In particular, FIG. 2A illustrates a multilevel mask 210 on a first conductor layer 220. The multilevel mask 210 illustrated in FIG. 2A may be a result of or provided by applying 110 a multilevel mask of the method 100 of multilevel mask circuit fabrication, according to various examples.

As illustrated in FIG. 2A, the first conductor layer 220 is adjacent to and supported by a substrate 202. The illustrated multilevel mask 210 includes a first level 212 and a second level 214. The first level 212 is thinner than the second level 214, as illustrated. The illustrated multilevel mask 210 further has an opening 216. The opening 216 exposes a portion 222 of the first conductor layer 220 on the substrate 202, as illustrated.

Referring again to FIG. 1, the method 100 of multilevel mask circuit fabrication further comprises etching 120 the exposed portion of the first conductor layer. According to various examples, etching 120 removes the exposed portion of the first conductor layer. Further, etching 120 provides undercutting of the first conductor layer at a periphery of the multilevel mask, according to various examples.

In particular, etching 120 may comprise selectively over-etching the first conductor layer along the periphery to undercut the multilevel mask and remove portions of the first conductor layer at the periphery that are not exposed by the multilevel mask. In other words, over-etching during etching 120 removes portions of the first conductor layer that underlie the multilevel mask. For example, a liquid-phase or 'wet etch' (e.g., using an etchant solution) may be used for etching 120 the first conductor layer. The first conductor layer may be exposed to the wet etch for a predetermined period of time that is long enough to not only remove the exposed portions of the first conductor layer, but also long enough to allow removal by the wet etch of the first conductor layer underlying the multilevel mask periphery. A depth or extent of the undercutting may be readily controlled by the predetermined period of time employed during etching 120, for example. In some examples, a dry etch (e.g., a plasma etchant) may be used to provide undercutting as long as the dry etch provides at least some anisotropic material removal of portions of the first conductor layer at the periphery of the multilevel mask.

Figure 2B:
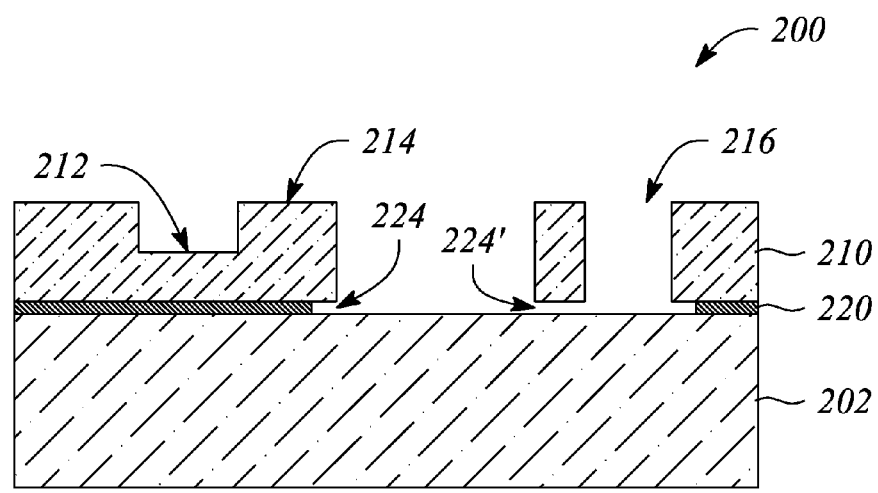
FIG. 2B illustrates a cross sectional view of the multilayer circuit illustrated in FIG. 2A after etching a first conductor layer, according to an example consistent with the principles described herein.

FIG. 2B illustrates a cross sectional view of the multilayer circuit 200 illustrated in FIG. 2A after etching 120 the first conductor layer 220, according to an example consistent with the principles described herein. In particular, FIG. 2B illustrates a result of etching 120 the exposed portions 222 of the first conductor layer 220. As illustrated in FIG. 2B, etching 120 has not only removed the exposed portion 222 of the first conductor layer 220, but etching 120 has also undercut the multilevel mask 210 at locations 224. A depth D of the undercutting may be controlled by a length of exposure to an etchant (e.g., a predetermined etching time) during etching 120, for example.

Note that undercutting may remove substantially the all of the first conductor layer 220 under particular mask portions, of the multilevel mask 210. For example, the conductor material of the first conductor layer 220 may be completely removed from the location 224' if a width of the overlying multilayer mask is less than about two times the undercutting depth D. Removal of the conductor material of the first conductor layer 220 in certain locations 224' during etching 120 may be used to selectively isolate a portion of the patterned first conductor layer 220 from another portion or another conductive material (e.g., at locations 224' illustrated in FIG. 2C).

Referring again to FIG. 1, the method 100 of multilevel mask circuit fabrication further comprises depositing 130 a second conductor layer. In particular, the second conductor layer is deposited 130 to cover the multilevel mask. Depositing 130 the second conductor layer may further cover a portion of the substrate exposed by etching 120. In some examples, depositing 130 may substantially cover in a conformal manner an entire surface of both the multilevel mask along with any portions of the substrate that may be exposed, for example.

Figure 2C:
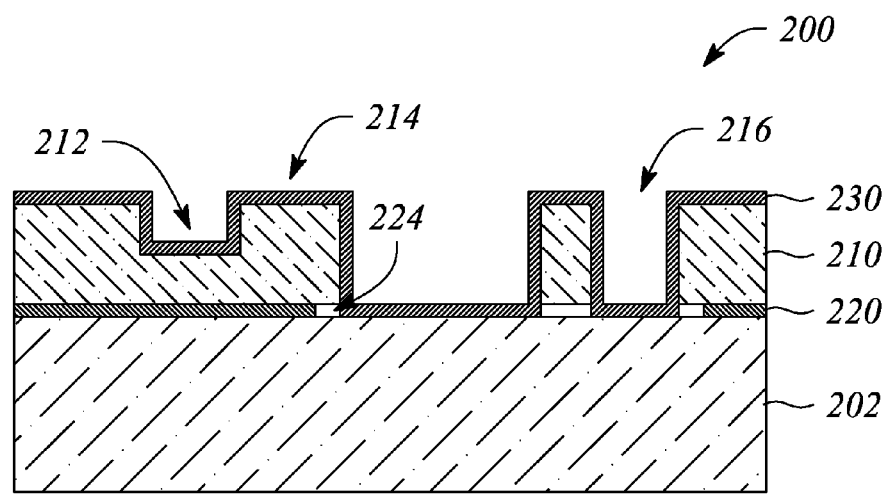
FIG. 2C illustrates a cross sectional view of the multilayer circuit illustrated in FIG. 2B after depositing a second conductor layer, according to an example consistent with the principles described herein.

FIG. 2C illustrates a cross sectional view of the multilayer circuit 200 illustrated in FIG. 2B after depositing 130 the second conductor layer, according to an example consistent with the principles described herein. As illustrated, the second conductor layer 230 conformally coats the multilayer circuit 200. In particular, as a result of depositing 130, the second conductor layer 230 coats the multilevel mask 210 including the first level 212 and the second level 214. The second conductor layer 230 also coats the substrate 202 in the openings 216 of the multilayer mask 210, as illustrated. Further, the second conductor layer 230 is electrically isolated from the first conductor layer 220 by the undercutting at locations 224, as illustrated.

In some examples, depositing 130 the second conductor layer may be performed using a substantially isotropic deposition. For example, the second conductor layer 230 may be deposited 130 using an isotropic deposition method including, but not limited to, evaporative deposition and sputtering. Isotropic deposition may prevent the second conductor layer from filling up spaces under the multilevel mask at the locations 224 of undercutting and contacting or connecting to the first conductor layer 220 at those locations, for example. Isotropic deposition in conjunction with the undercutting at locations 224 may provide electrical isolation between the first and second conductor layers 220, 230, according to various examples.

Referring again to FIG. 1, the method 100 of multilevel mask circuit fabrication further comprises selectively removing 140 a portion of the second conductor layer. In particular, the portion of the second conductor layer that is selectively removed 140 is a portion overlying the multilevel mask, according to various examples. In some examples, the selectively removed portion may be a portion overlying the second level of the multilevel mask, for example. In theses examples, another portion of the second conductor layer may not be removed (i.e., may remain after selective removal 140). The other portion that is not removed may be a portion overlying a first mask level, for example. In some examples, a portion of the second conductor layer that is not overlying the multilayer mask is not removed. For example, a portion of the second conductor layer that is deposited 130 on the substrate (e.g., exposed by etching 120) may remain after selective removal 140.

In some examples (e.g., as illustrated), selectively removing 140 the second conductor layer overlying the multilevel mask comprises covering 142 a surface of the second conductor layer on the multilayer mask and substrate with another mask material. According to some examples, covering 142 fills various voids and depressions to produce a covering mask layer having a substantially planar surface. The substantially planar surfaced mask layer may entirely cover the second conductor, in some examples.

For example, the surface may be covered 142 by flood coating the second conductor layer with the other mask material in a liquid form (e.g., a liquid polymer) and then solidifying the other mask material. The other mask material may be a liquid form of a mask material used in the multilevel mask, for example. The other mask material may be a thermally or UV curable material that is solidified accordingly. Flood coating may be performed by spin coating, spray coating, etc. In other examples, the liquid polymer may be applied using other application methods including, but not limited to, slot die and gravure methods. The liquid of the other mask material may be solidified having a substantially planar surface. In other examples, surface planarity may be provided by mechanical polishing or another method of surface planarization.

Selectively removing 140 may further comprise eroding 144 the other mask material to expose the portion of the second conductor layer overlying the multilevel mask. In particular, eroding 144 may expose the portion of the second conductor layer that is to be selectively removed 140. In some examples, a selectively exposed portion is a portion of the second conductor layer overlying a second level (e.g., a thicker portion) of the multilevel mask. In some examples, another portion of the second conductor layer overlying a first level (e.g., a thinner portion) of the multilevel mask is not exposed by eroding 144. According to some examples, the other mask material may be eroded 144 using plasma etching.

Selectively removing 140 may further comprise etching 146 the exposed portion of the second conductor layer to remove the exposed portion. Etching 146 may employ either a wet etch (e.g., a wet etchant or etchant solution) or a dry etch (e.g., a plasma etchant), according to various examples. During etching 146, the other mask material may protect portions of the second conductor layer (e.g., on the substrate or overlying the first level) that are not exposed.

Figure 2D:
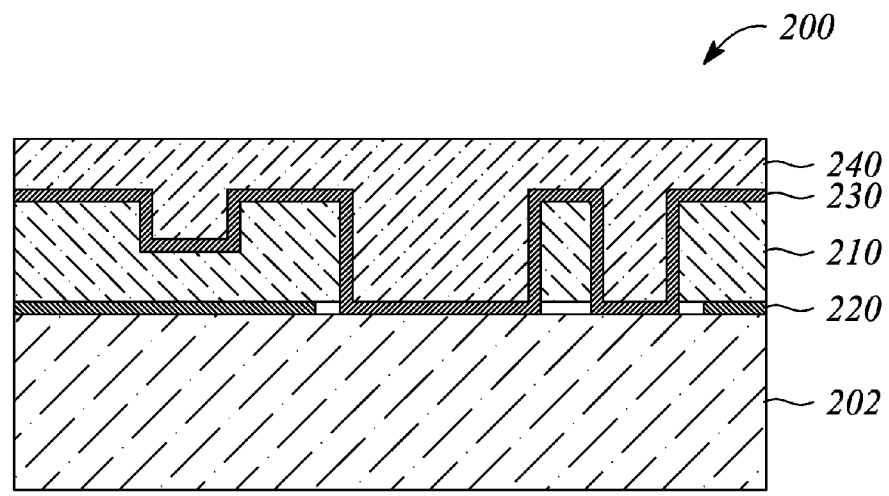
FIG. 2D illustrates a cross sectional view of the multilayer circuit illustrated in FIG. 2C after covering the second conductor layer with another mask material, according to an example consistent with the principles described herein.

FIG. 2D illustrates a cross sectional view of the multilayer circuit 200 illustrated in FIG. 2C after covering 142 the second conductor layer 230 with another mask material 240, according to an example consistent with the principles described herein. As illustrated the surface is covered 142 with the other mask material 240 to completely cover a surface of the second conductor layer 230. The other mask material 240 substantially fills voids and depressions in the surface, and a surface of the other mask material 240 is substantially planar after covering 142, as illustrated in FIG. 2D.

Figure 2E:
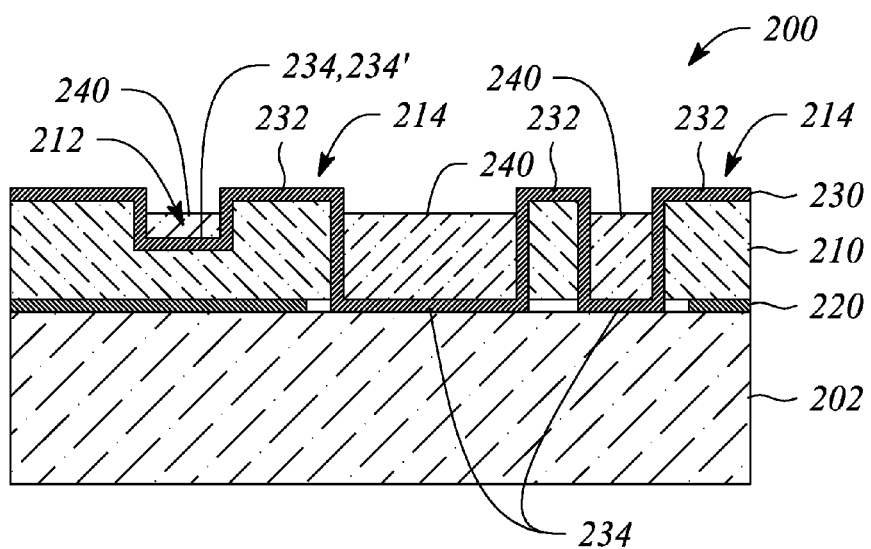
FIG. 2E illustrates a cross sectional view of the multilayer circuit illustrated in FIG. 2D following eroding the other mask material, according to an example consistent with the principles describe herein.

FIG. 2E illustrates a cross sectional view of the multilayer circuit 200 illustrated in FIG. 2D following eroding 144 the other mask material, according to an example consistent with the principles describe herein. As illustrated in FIG. 2E, eroding 144 has exposed portions 232 of the second conductor layer 230 overlying the second level 214 of the multilevel mask 210. Other portions 234 of the second conductor layer 230 that are either overlying the first level 212 or directly on the substrate 202 (e.g., sitting on the substrate surface) are not exposed by eroding 144, as illustrated in FIG. 2E. In particular, the other mask material 240 covers and protects the other portions 234 of the second conductor layer 230 after eroding 144. In some examples, a portion 234' of the second conductor layer 230 not exposed by eroding 144 (overlying the first level 212 of the multilevel mask 210) that is located over the first conductor layer 220 and the multilevel mask 210 may form a crossover of the multilayer circuit 200, as is explained below.

Figure 2F:
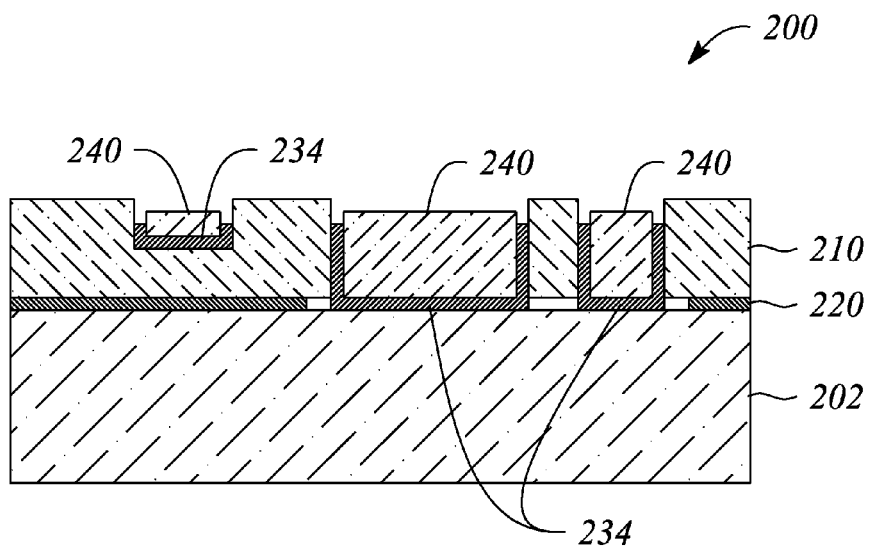
FIG. 2F illustrates a cross sectional view of the multilayer circuit illustrated in FIG. 2E following etching of exposed portions of the second conductor layer, according to an example consistent with the principles described herein.

FIG. 2F illustrates a cross sectional view of the multilayer circuit 200 illustrated in FIG. 2E following etching 146 of exposed portions of the second conductor layer 230, according to an example consistent with the principles described herein. As illustrated in FIG. 2F, the exposed portions of the second conductor layer 230 have been removed by etching 146. The portions 234 of the second conductor layer 230 that were not exposed by eroding 144 are not removed by etching 146 and thus remain, as illustrated.

Figure 2G:
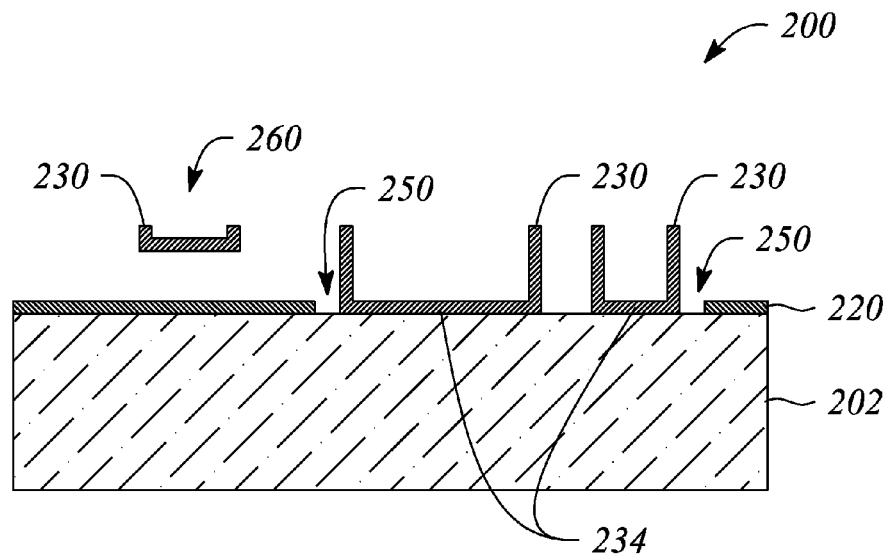
FIG. 2G illustrates a cross sectional view of the multilayer circuit illustrated in FIG. 2F after removal of mask materials, according to an example consistent with the principles described herein.

FIG. 2G illustrates a cross sectional view of the multilayer circuit 200 illustrated in FIG. 2F after removal of all mask materials 210, 240, according to an example consistent with the principles described herein. In particular, FIG. 2G illustrates the multilayer circuit 200 with the first conductor layer 220 electrically isolated from the second conductor layer 230. Electrical isolation may be provided by a spacing between patterned portions of the first and second conductor layers 220, 230 represented by gaps 250, for example, corresponding to the undercutting 224.

FIG. 2G also illustrates a crossover 260 that passes over, but is electrically isolated from, an underlying portion of the first conductor layer 220. The crossover 260 may connect portions of the second conductor layer 230 without connecting to a portion of the first conductor layer 220 that passes under the crossovers 260. The crossover 260 may be formed from the portion 234' of the second conductor layer 230 that was overlying the first conductor layer 220, for example. The method 100 multilevel mask circuit fabrication may be used to fabricate various circuits that incorporate a crossover bridge, for example, a substantially unsupported or 'floating' crossover bridge. In particular, the method 100 may be used to fabricate a projective capacitive touch sensor in accordance with an example of the principles described herein. A description of projective capacitive touch sensors is described further below. In some examples (not illustrated), the multilevel mask 210 may remain after etching 146, for example remaining under the crossover bridge to provide a physical support to the crossover bridge. In some examples (not illustrated), the first conductor layer 220 may comprise a bridged gapped conductor, which is further described below in accordance with an example of the principles described herein.

Figure 3:
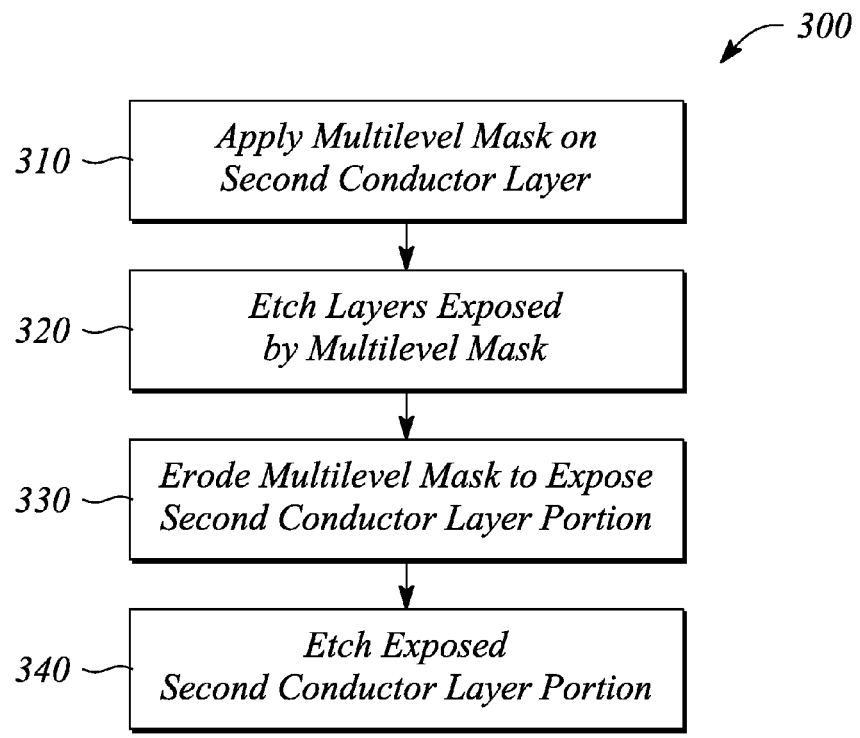
FIG. 3 illustrates flow chart of a method of multilevel mask circuit fabrication, according to another example consistent with the principles described herein.

FIG. 3 illustrates flow chart of a method 300 of multilevel mask circuit fabrication, according to another example consistent with the principles described herein. In particular, the method 300 of multilevel mask circuit fabrication illustrated in FIG. 3 provides patterning of a first conductor layer with a second conductor layer underlying a multilevel mask, and wherein the first conductor layer comprises a bridged gapped conductor. Examples of a bridged gapped conductor are described in more detail below. Further, the method 300 of multilevel circuit fabrication illustrated in FIG. 3 provides electrical isolation between the first and second conductor layers using both the bridged gapped conductor and an insulating layer between the second conductor layer and the first conductor layer.

As illustrated in FIG. 3, the method 300 of multilevel mask circuit fabrication comprises applying 310 a multilevel mask on the second conductor layer. According to various examples, the multilevel mask and the application thereof may be substantially similar to the multilevel mask and its application described above with respect the method 100 of multilevel mask circuit fabrication. In particular, the multilevel mask may be formed in situ using imprint lithography (e.g., nanoimprint lithography) or another similar method. Alternatively, the multilevel mask may be a pre-patterned or pre-formed material layer or sheet that can be applied. Further, the multilevel mask may have a plurality of levels (e.g., a first level and a second level), as described above, and may expose a portion of a layer underlying the multilevel mask after being applied 310. However unlike the above, both of the first conductor layer and the second conductor layer underlie the multilevel mask, and the multilevel mask is applied 310 on the second conductor layer (e.g., a surface thereof), according to various examples. Further, according to various examples, the multilevel mask may expose a portion of the second conductor layer (e.g., after removing a residue portion or level zero of the multilevel mask).

Figure 4A:
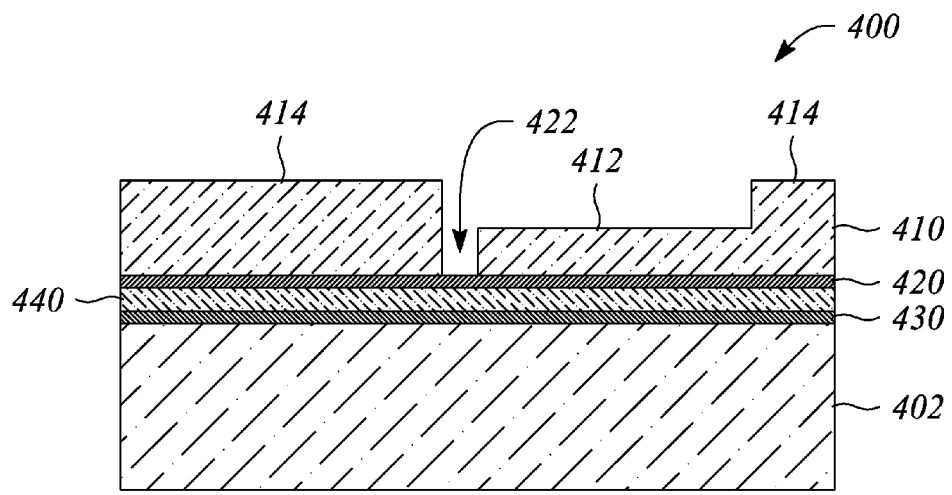
FIG. 4A illustrates a cross sectional view of a multilayer circuit during fabrication according to a method of multilevel mask circuit fabrication, according to an example consistent with the principles described herein.

FIGS. 4A-4D illustrate the fabrication of a multilayer circuit 400 using the method 300 for example. FIG. 4A illustrates a cross sectional view of a multilayer circuit 400 during fabrication according to the method 300 of multilevel mask circuit fabrication, according to an example consistent with the principles described herein. In particular, FIG. 4A illustrates a multilevel mask 410 on a second conductor layer 420. The multilevel mask 410 on the second conductor 420 illustrated in FIG. 4A may be a result of or provided by applying 310 of the method 300 of multilevel mask circuit fabrication, according to various examples. Further, as illustrated in FIG. 4A, the second conductor layer 420 is above a first conductor layer 430. The first conductor layer 430 is adjacent to and supported by a substrate 402 and an insulating layer 440 is sandwich between the second and first conductor layers 420, 430, as illustrated. Further, as illustrated, the multilevel mask 410 includes a first level 412 and a second level 414. The first level 412 is thinner than the second level 414, as illustrated. In addition, the multilevel mask 410, as illustrated, exposes a portion 422 of the second conductor layer 420.

Referring again to FIG. 3, the method 300 of multilevel mask circuit fabrication further comprises etching 320 layers exposed by the multilevel mask, for example, to remove portions of the second conductor layer, the insulating layer and the first conductor layer exposed by the multilevel mask. According to various examples, etching 320 removes the materials within the area exposed by the multilevel mask from each of the second conductor layer, the insulating layer and the first conductor layer to expose the substrate below the first conductor layer. In particular, following etching 320, a portion of the substrate is cleaned of all overlying layers.

In some examples, etching 320 the exposed layers comprises using an etchant to remove a portion of the second conductor layer exposed by the multilevel mask. In some examples, the etchant may be a wet etchant (e.g., an etchant solution). In other examples, the etchant may be a dry etchant (e.g., a plasma) or a combination of a wet and dry etchants. The etchant used in etching 320 may be applied through an opening in the multilevel mask that exposes the exposed portion of the second conductor, according to various examples.

Once the exposed portion of the second conductor layer is removed, etching 320 further comprises removing a portion of the insulating layer subsequently exposed by the multilevel mask. The exposed portion of the insulating layer may be directly below an area from which the exposed portion of the second conductor layer was removed by the etchant, for example. Removal of the exposed portion of the insulating layer may be provided by applying an etchant that acts on material of the insulating layer. For example, the exposed portion of the insulating layer may be removed by plasma etching (e.g., if the dielectric is a polymer) or by a suitable wet etchant (e.g., etchant solution). In some examples, the same etchant used to remove the exposed portions of the second conductor layer may also be used to remove the exposed portions of the insulating layer.

Etching 320 further comprises using an etchant to remove a portion of the first conductor layer subsequently exposed by the multilevel mask following removal of the insulating layer exposed portion. Removing the exposed first conductor portion may comprise using the same etchant used to etch the second conductor layer, for example. In other examples, the same etchant may be used to remove the exposed portions of each of the second conductor layer, the insulating layer and the first conductor layer during etching 320. Whether or not the exposed portions of all three of the second conductor layer, the insulating layer and the first conductor layer are removed by the etchant may be determined by an amount of time during which the various layers are exposed to the etchant, for example.

Figure 4B:
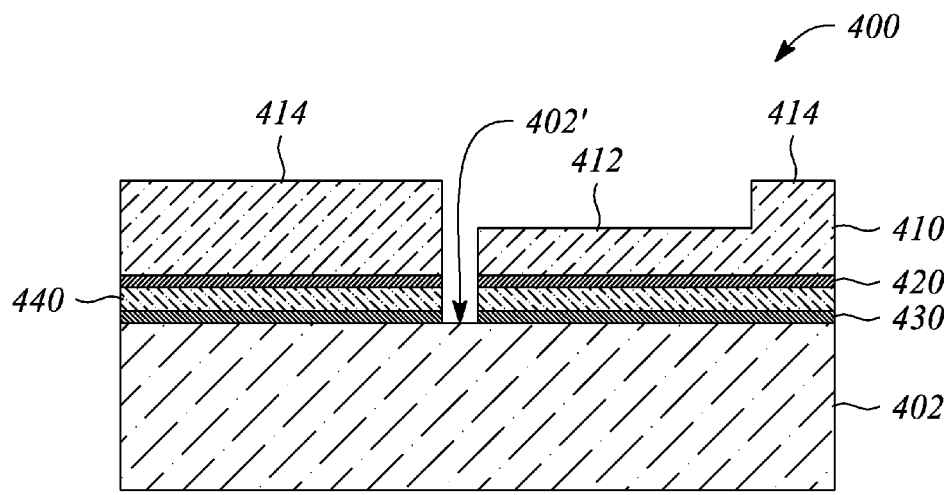
FIG. 4B illustrates a cross sectional view of the multilayer circuit illustrated in FIG. 4A after etching, according to an example consistent with the principles described herein.

FIG. 4B illustrates a cross sectional view of the multilayer circuit 400 illustrated in FIG. 4A after etching 320, according to an example consistent with the principles described herein. In particular, FIG. 4B illustrates a result of etching 320 to remove the exposed portion 422 of the second conductor layer 420, followed by removal of corresponding portions of the insulating layer 440 and the first conductor layer 430. As illustrated, a portion 402' of the substrate 402 is exposed after etching 320. Etching 320 of the layers substantially patterns the layers, in particular the first and second conductor layers.

Referring again to FIG. 3, the method 300 of multilevel mask circuit fabrication further comprises eroding 330 the multilevel mask to expose the second conductor layer in portions corresponding to a first level of the multilevel mask. After eroding 330, a second level of the multilevel mask continues to cover other portions of the second conductor layer, according to various examples. Eroding 330 may be accomplished by plasma etching, for example.

Figure 4C:
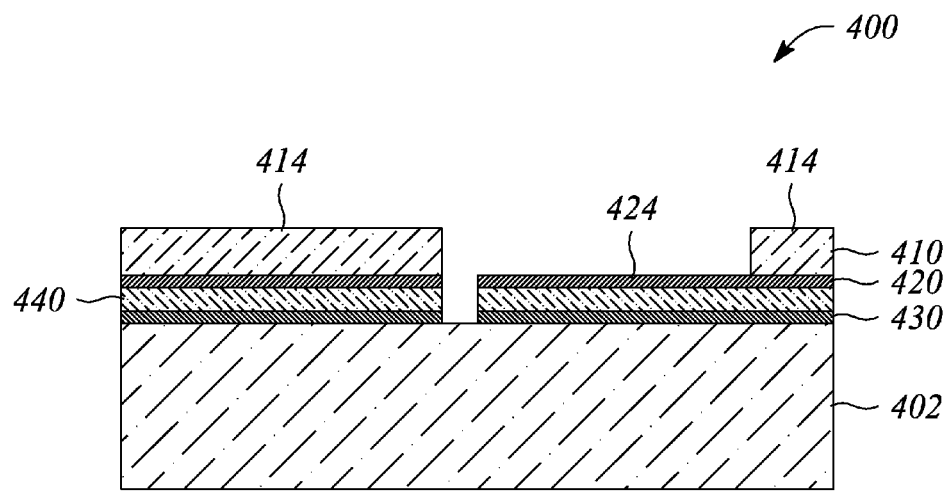
FIG. 4C illustrates a cross sectional view of the multilayer circuit illustrated in FIG. 4B after eroding a multilevel mask, according to an example consistent with the principles described herein.

FIG. 4C illustrates a cross sectional view of the multilayer circuit 400 illustrated in FIG. 4B after eroding 330 the multilevel mask, according to an example consistent with the principles described herein. As illustrated, eroding 330 has generally removed mask material corresponding to the first level 412 of the multilevel mask 410 to expose a portion 424 of the second conductor layer 420. Other portions of the second conductor layer 420 corresponding to the second level 414 of the multilevel mask remain covered and thus protected by the multilevel mask following eroding 330.

Referring again to FIG. 3, the method 300 of multilevel mask circuit fabrication further comprises etching 340 the portion of the second conductor layer exposed by eroding 330. Etching 330 the exposed portions of the second conductor layer may employ an etchant that is substantially similar to the etchant used in etching 320, for example. Following etching 340 of the exposed portions, the second conductor layer is considered to be patterned. In some examples, the circuit fabrication may be complete after etching 340. In other examples, portions of the insulating layer exposed by etching 340 the second conductor layer may be removed to complete the circuit fabrication. Exposed portions of the insulating layer may be removed in a manner that is substantially similar to removing the insulating layer during etching 320, for example.

Figure 4D:
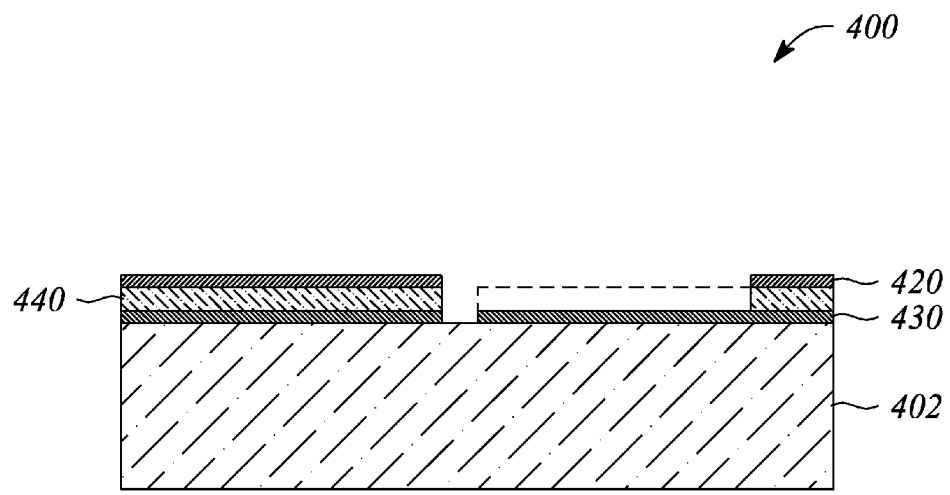
FIG. 4D illustrates a cross sectional view of the multilayer circuit illustrated in FIG. 4C following etching, according to an example consistent with the principles described herein.

FIG. 4D illustrates a cross sectional view of the multilayer circuit 400 illustrated in FIG. 4C following etching 340 and removal of remaining portions of the multilevel mask, according to an example consistent with the principles described herein. In particular, as illustrated, exposed portion 424 of the second conductor layer (FIG. 4C) produced by eroding 330 has been etched 340 to remove the exposed portion 424. Further, as illustrated, a portion of the insulating layer 440 exposed when the second conductor layer 420 was etched 340 has also been removed (e.g., by etching). A dashed line in FIG. 4D illustrates where the exposed portion of the insulating layer would have been prior to removal. Finally, remaining portions of the multilevel mask 410 (e.g., the second level 414 thereof in FIG. 4C) have been removed from the multilayer circuit 400, as illustrated in FIG. 4D. The multilayer circuit 400 may be any of various types of circuits, for example a projective capacitive touch sensor having a bridged gapped conductor and a supported crossover bridge, as further described below. Therefore, the method 300 of multilevel mask circuit fabrication also may be a method of fabricating such a projective capacitive touch sensor.

In some examples (not illustrated), the method 300 of multilevel mask circuit fabrication may further comprise, prior to applying 310 the multilevel mask, providing a substrate with one or more of the first conductor layer, the insulating layer and the second conductor layer on the substrate. Alternatively, in some examples (not illustrated), the method 300 may further comprise receiving a substrate that comprises one or more of these material layers already in place and providing the layers that are not in place (e.g., a substrate with a first conductor layer, but no insulating layer or second conductor, or a substrate with the first conductor layer and the insulating layer, but no second conductor).

In some examples, providing a substrate of layers comprises depositing a conductor material on a surface of the substrate to form the first conductor layer and patterning the first conductor layer to form the bridged gapped conductor. Providing a substrate further comprises depositing the insulating layer on the bridged gapped conductor of the patterned first conductor layer and depositing the second conductor layer on the deposited insulating layer. As a result, the substrate comprises a stack of layers, for example as illustrated in FIG. 4A, the stack comprising the first conductor layer 430, the insulating layer 440 and the second conductor layer 420.

According to some examples of the principles described herein, the bridged gapped conductor may be formed by patterning the first conductor layer, as noted above. Patterning may comprise defining a pattern of the bridged gapped conductor in the first conductor layer using one or more of photolithography, imprint lithography and laser ablation, according to various examples. In particular, the first conductor layer may be patterned using an appropriate method into a plurality of parallel, spaced apart, traces with periodic bridging between adjacent parallel traces. A width of the traces may be between about 100 nanometers (nm) and about 500 microns (μm). In another example, the width of the traces may be between about 2 μm and about 200 μm. A gap between the traces may be between about 10 nm and several microns, according to various examples. For example, the gap may be between about 100 nm and about 3 μm.

A spacing of the periodic bridging (i.e., pitch) is determined by an electrical isolation condition dictated by a circuit employing the bridged gapped conductor. For example, a pitch of the bridging may be chosen to be small enough to insure that a sufficiently large area of interconnected conductor is present in the bridged gapped conductor after patterning into a circuit pattern. Simultaneously, the bridging pitch may be chosen large enough to provide sufficient electrical isolation. An example of bridging pitch is discussed below with respect to a projective capacitive touch sensor application.

Figure 5:
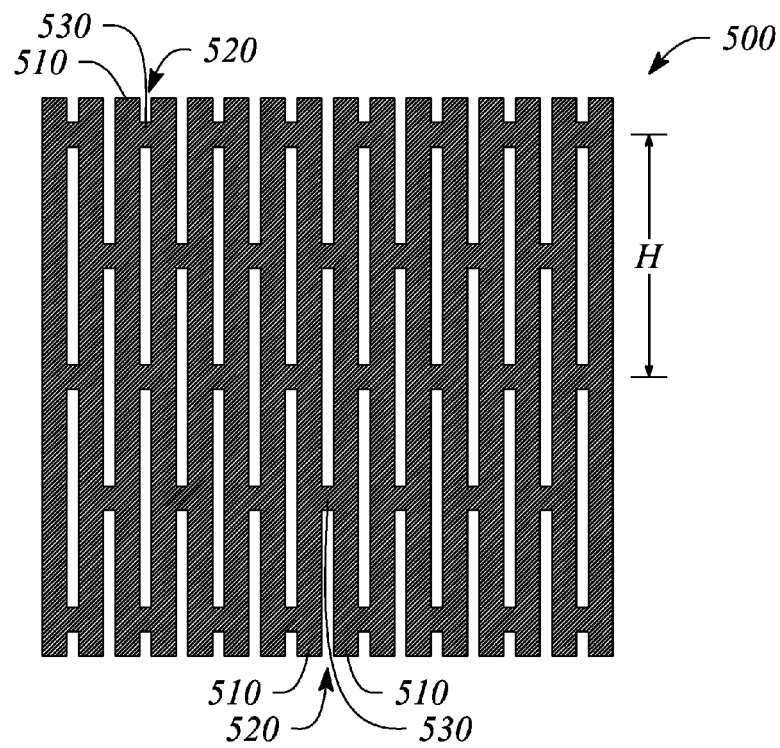
FIG. 5 illustrates a plan view of a bridged gapped conductor, according to an example consistent with the principles described herein.

FIG. 5 illustrates a plan view of a bridged gapped conductor 500, according to an example consistent with the principles described herein. As illustrated, the bridged gapped conductor 500 comprises parallel, spaced apart traces 510 separated by gaps 520 between the traces 510. The traces 510 of the bridged gapped conductor 500 are interconnected across the gaps 520 by bridges 530 spaced periodically along the traces 510. Further as illustrated, the bridges 530 alternate on either side of a trace 510 to form a serpentine interconnection of the traces 510. In other examples (not illustrated) the bridges 530 either may be aligned (i.e., not alternating) or may even be randomly located along the traces 510. The bridging pitch of the bridged gapped conductor 500 denoted by dimension H, as illustrated in FIG. 5. According to various examples, the gaps 520 in conjunction with the bridges 530 may facilitate providing electrical isolation between a first portion and a second portion of the bridged gapped conductor (e.g., after patterning), as described below.

Materials useful for the various layers of the multilayer circuits described herein include those described below. In some examples, a conductor material of the first conductor layer and a conductor material of the second conductor layer may be substantially similar. In other examples, the conductor materials of the first and second conductor layers may be substantially dissimilar. For example, one or both of the first conductor layer and the second conductor layer may comprise a metal such as, but not limited to, copper (Cu), chromium (Cr), molybdenum (Mo), titanium (Ti), tungsten (W), nickel (Ni), aluminum (Al) and gold (Au). In some examples, the conductor material may comprise combinations of metals including metal alloys and metal combinations arranged in layers. In other examples, the conductor material may comprise a conductive polymer film or a doped semiconductor film (e.g., doped polysilicon).

According to various examples, the conductor material of one or both of the first conductor layer and the second conductor layer may be a transparent conductor. Herein, a 'transparent' conductor is defined as a conductor that is generally considered to be optically transparent in one or more of an infrared, a visible and an ultraviolet spectral range. A variety of transparent conductive oxides (TCOs) such as, but not limited to, indium tin oxide (ITO), fluorine doped tin oxide (FTO), indium-doped cadmium oxide and aluminum-doped zinc oxide (AZO) may be used. Moreover, various organic films may be used as the transparent conductor material including, but not limited to, films using carbon nanotubes and graphene as well as certain polymer films such as, but not limited to, poly(3,4-ethylenedioxy-thiophene). The conductor material of one or both of the first conductor layer and the second conductor layer, whether transparent or substantially non-transparent, may be deposited using a variety of thin film deposition methods including, but not limited to, evaporation, sputtering, metal-organic chemical vapor deposition (MOCVD), spray pyrolysis, and pulsed laser deposition (PLD) as well as spin coating or spray coating in the case of polymer films, for example.

Etchants used in various etching operations described above are generally selected, in part, according to a constituent material of the particular layer or layers being etched. For example, plasma etching in various forms may be used as a dry etch when removing a polymer material (e.g., eroding the multilevel mask). However, a dry etch may be employed with other materials and layers, as noted above. For example, a fluorocarbon (C—F) plasma etch (e.g., tetrafluoromethane (CFO or sulfur hexafluoride ($SF_6$) may be employed to etch a conductor layer comprising a metal such as molybdenum (Mo) or titanium (Ti). Wet etchants are also typically selected based on the material or material combinations being etched. For example, a wet etchant such as, but not limited to, a hydrofluoric (HF) acid etchant ($HF:H_2O_2:H_2O$) and hydrochloric acid etchant ($HCl:H_2O$) may be used to etch a conductor layer comprising indium tin oxide (ITO). Etching the copper-based conductor layer may be accomplished using a wet etchant such as Transene Copper Etch APS-100, for example. Transene Copper Etch APS-100 is a copper-targeted wet etching product of Transene Corporation of Danvers, Mass. In a further example, when the conductor layer comprises silicon (e.g., doped polysilicon) as a conductor material, a wet etch comprising a potassium hydroxide (KOH) solution or an aqueous solution including nitric acid and ammonium fluoride ($HNO_3/NH_4F:H_2O$) may be used as the etchant.

In some examples, the insulating layer described above (e.g., layer 440) may comprise any of a variety of organic insulating materials including, but not limited to, PMMA, polyimide, polyester, polycarbonate, polytetrafluorethylene (PTFE), and various thermally or UV cured resins. The organic insulating materials may be deposited as the insulating layer using spin coating, gravure, slot die, or similar methods of forming a layer. In other examples, the insulating layer may comprise an insulating oxide film, insulating nitride film, insulating sulfide film or other similar inorganic insulating films. Insulating oxides, nitrides, fluorides and sulfides include, but are not limited to, silicon dioxide ($SiO_2$), aluminum oxide ($Al_2O_3$), tin oxide ($SnO_2$), titanium oxide ($TiO_2$), silicon nitride ($Si_3N_4$), tantalum oxide ($Ta_2O_5$), tantalum nitride (TaN), magnesium fluoride ($MgF_2$), and zinc sulfide (ZnS), for example. An insulating layer comprising inorganic materials such as oxides, nitrides, sulfides, and the like, may be deposited as a layer or film using a variety of methods including, but not limited to, sputtering and chemical vapor deposition. The insulating layer may be etched using one or both of a wet etch and a dry etch. For example, an organic material based insulating layer may be etched using plasma etching (i.e. dry etching). An inorganic insulating film such as silicon dioxide may be etched using a wet etchant solution such as, but not limited to, an aqueous solution of hydrofluoric acid, for example. A silicon dioxide film may also be etched by $CHF_3$ and $O_2$ in a plasma reactor. The plasma etching conditions generally depend on an oxide film thickness as well as a design of the plasma reactor.

According to some examples of the principles described herein, a multilayer circuit is provided. According to various examples, the multilayer circuit may be substantially any circuit comprising a first conductor layer and a second conductor layer in which at least a portion of first conductor layer is crossed over or bridged by a portion of the second conductor layer. Further, the bridging portion of the second conductor layer is electrically isolated from the first conductor layer at least at a point of bridging in the multilayer circuit, by definition herein. Examples of multilayer circuits include, but are not limited to, a projective capacitive touch sensor, an active backplane circuit, and a crosspoint or crossbar array. For discussion purposes, herein the projective capacitive touch sensor will be used to represent a multilayer circuit by way of example and without loss of generality.

According to some examples, the projective capacitive touch sensor comprises a first electrode adjacent to a second electrode. In some examples, the first electrode may be an electrode of a first plurality of electrodes and the second electrode may be an electrode of a second plurality of electrodes. Electrodes of the first plurality including the first electrode may be electrically interconnected one another. Similarly, electrodes of the second plurality including the second electrode may be electrically interconnected with one another. Further, electrodes of the first plurality are electrically isolated from electrodes of the second plurality. In some examples, electrodes of the first plurality are interspersed with electrodes of the second plurality (e.g., forming a grid pattern of intersperse electrodes). Further, electrodes of the first and second pluralities may be arranged in a rectangular array or grid pattern with electrodes of the first plurality interconnected as a plurality of rows of electrodes and electrodes of the second plurality interconnected as a plurality of columns of electrodes in the grid pattern. A change in capacitance between the first electrode and the second electrode can be used to sense a location in the grid that is touched, for example.

In some examples, the projective capacitive touch sensor is supported by a substrate, wherein both pluralities of electrodes are on the same surface of the substrate. In some examples, the substrate may be transparent and further the substrate may be flexible (e.g. a plastic sheet or film). For example, the substrate may comprise a flexible transparent polyester sheet or film. In other examples, the transparent substrate may be a transparent sheet of film comprising, but is not limited to, glass, polystyrene, acrylic (PMMA), and polycarbonate.

Figure 6A:
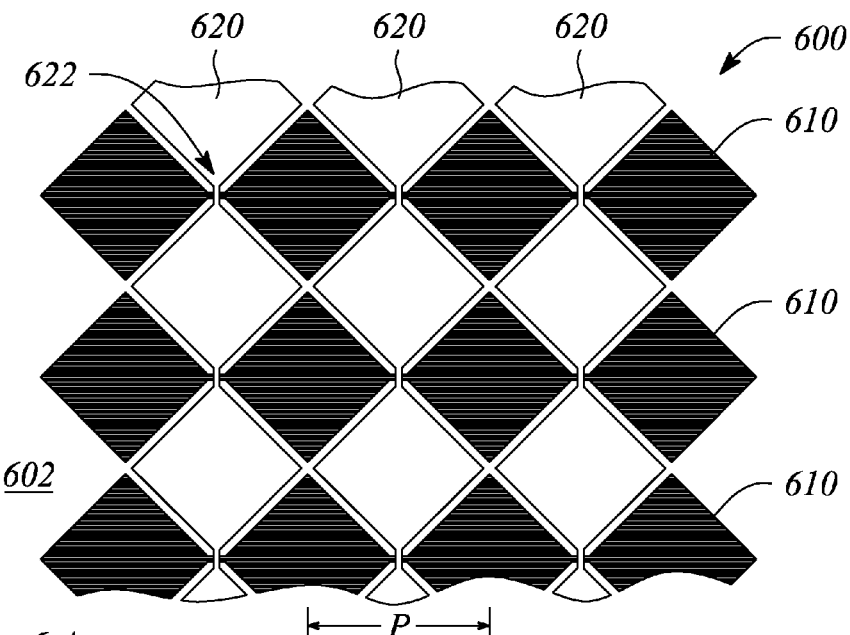
FIG. 6A illustrates a plan view of a projective capacitive touch sensor, according to an example consistent with the principles described herein.
Figure 6B:
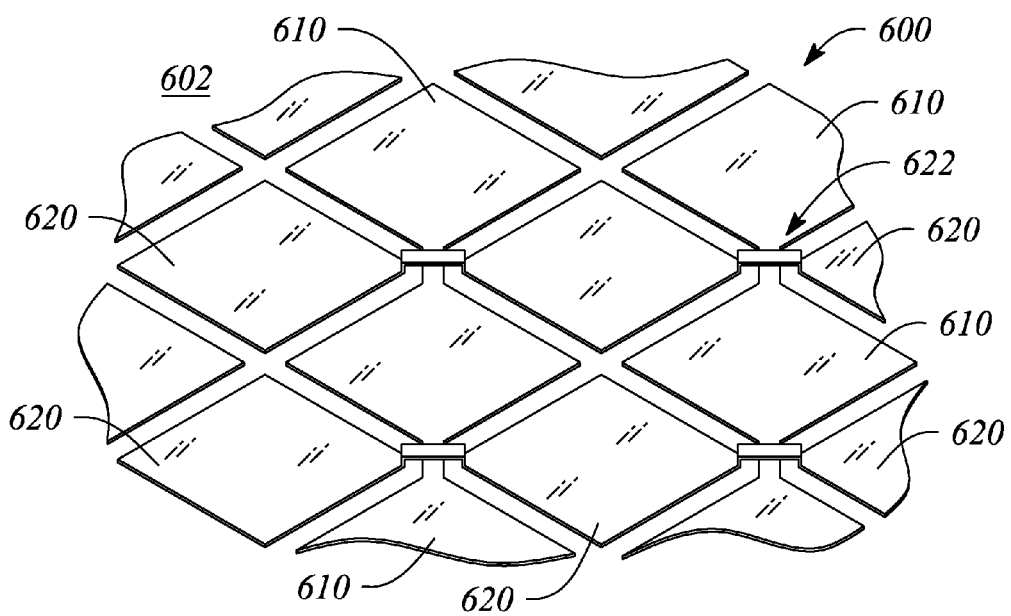
FIG. 6B illustrates a perspective view of a portion of the projective capacitive touch sensor illustrated in FIG. 6A, according to an example consistent with the principles described herein.

FIG. 6A illustrates a plan view of a projective capacitive touch sensor 600, according to an example consistent with the principles described herein. FIG. 6B illustrates a perspective view of a portion of the projective capacitive touch sensor 600 illustrated in FIG. 6A, according to an example consistent with the principles described herein. In particular, FIG. 6A illustrates a first plurality of electrodes 610 interconnected as a row of electrodes and a second plurality of electrodes 620 interconnected as a column of electrodes in a rectangular grid of electrodes of the projective capacitive touch sensor 600. As illustrated, electrodes 610 of the first plurality are directly interconnected along the row by interconnections that are coplanar with a material of the electrodes 610 of the first plurality. Electrodes 620 of the second plurality are interconnected by crossover bridges 622 along the column. The crossover bridges 622 pass over but are electrically isolated from a conductor material of the electrodes 610. FIG. 6B illustrates a crossover bridge 622 connecting a pair of electrodes 620 of the second plurality. As illustrated, the crossover bridge 622 passes over a connection between a pair of electrodes 610 of the first plurality. Further as illustrated, the electrodes 610, 620 are on and supported by a substrate 602.

As provided above, the method 100 of circuit fabrication illustrated in FIG. 1 may be used as a method of fabricating a projective capacitive touch sensor. In particular, a projective capacitive touch sensor may be fabricated according to method 100 of circuit fabrication wherein portions of a first conductor layer and a second conductor layer patterned using the multilevel mask correspond to opposing first electrodes and second electrodes of the projective capacitive touch sensor. For example, patterning the first conductor layer may provide first electrodes, while subsequent deposition 130 and removal 140 of a portion of the second conductor may provide the second electrodes. The first electrodes may be the electrodes 610 illustrated in FIG. 6A. Likewise, the second electrodes may be the electrodes 620 illustrated in FIG. 6A.

Further, the multilevel mask used in the method 100 of circuit fabrication may have a first mask level that is a thin region of the multilevel mask and a second mask level that is a relatively thicker region of the multilevel mask. A portion of the second conductor layer deposited on the first mask level may form a crossover bridge that is above and electrically isolated from a portion of the patterned first conductor layer passing under the crossover bridge. In some examples, the crossover bridge is configured to interconnect a pair of the second electrodes (e.g., electrodes 620) and to cross over an interconnection between a pair of the first electrodes (e.g., electrodes 610) of the projective capacitive touch sensor. See, for example, the floating crossover bridge 260 in FIG. 2G. The crossover bridge 260 provided by the portion of the second conductor layer 230 deposited on the first mask level 212 may be substantially similar to the crossover bridge 622 illustrated in FIG. 6B.

Materials for one or both of the first electrodes and the second electrodes may include a transparent conductor material, such as any of those described above. In some examples, a substrate (e.g., substrate 602 in FIGS. 6A-6B) that supports the first and second electrodes is also transparent. The transparent conductor material on a transparent substrate may be employed to fabricate a substantially transparent projective capacitive touch sensor, for example. Moreover, the first conductor layer used in the method (e.g., method 100) of fabricating a projective capacitive touch sensor (e.g., sensor 600) may be a bridged gapped conductor (e.g., bridged gapped conductor 500). The bridged gapped conductor may comprise a transparent conductor material, according to some examples.

According to some examples of the principles described herein, the projective capacitive touch sensor may comprise a first electrode comprising a patterned portion of a bridged gapped conductor of a first conductor layer. The bridged gapped conductor has a plurality of traces separated by gaps, the gaps being periodically bridged to electrically connect adjacent parallel traces to one another, for example as illustrated in FIG. 5. The projective capacitive touch sensor further comprises a second conductor layer comprising a second electrode adjacent to and laterally offset from the first electrode and an insulating layer to electrically isolate a portion of the bridged gapped conductor of the first conductor layer from an overlying portion of the second conductor layer comprising the second electrode. At least some of the gaps in the patterned portion of the bridged gapped conductor of the first conductor layer are configured to further electrically isolate the first electrode from the second electrode. In some examples, the first conductor layer and the second conductor layer comprise a transparent conductor material. A spacing of the periodic bridging of the gaps is less than a pitch of a plurality of electrodes comprising the first electrode in some examples. As mentioned above, the projective capacitive touch sensor may be manufactured according to method 300 of multilevel mask circuit fabrication.

For example, the projective capacitive touch sensor may be substantially similar to the projective capacitive touch sensor 600 illustrated in FIG. 6A. In particular, an electrode 610 of the first plurality illustrated in FIG. 6A may comprise a bridged gapped conductor layer having gaps (not illustrated in FIG. 6A) that are periodically bridged. A pitch of the electrodes 610 of the first plurality is given by dimension P. Herein, the 'pitch' of the electrodes 610 (or equivalently a pitch of electrodes 620) is defined as a center-to-center spacing of electrodes along a row (or a column).

Figure 7A:
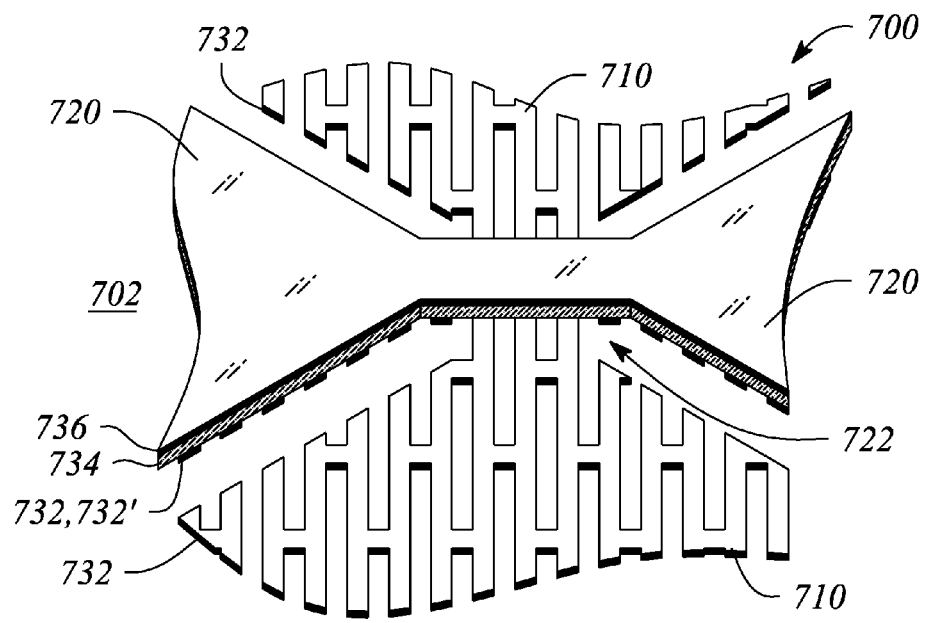
FIG. 7A illustrates an expanded perspective view of a portion of a projective capacitive touch sensor, according to an example consistent with the principles described herein.

FIG. 7A illustrates an expanded perspective view of a portion of a projective capacitive touch sensor 700, according to an example consistent with the principles described herein. The projective capacitive touch sensor 700 portion illustrated in FIG. 7A may be a portion of the projective capacitive touch sensor 600, illustrated in FIG. 6A. In particular, the portion illustrated in the expanded perspective includes a crossover bridge 722 connecting a pair of second electrodes 720 of the projective capacitive touch sensor 700. The crossover bridge 722 crosses over and is electrically isolated from a connection between a pair of first electrodes 710, as illustrated. Further, the projective capacitive touch sensor 700 is on a substrate 702, as illustrated.

As illustrated in FIG. 7A, the first electrodes 710 comprise a bridged gapped conductor of a first conductor layer 732 or simply the bridged gapped conductor layer 732 that is patterned into a shape of the first electrodes 710 (e.g., a diamond shape as illustrated in FIG. 6A). Further, as illustrated in FIG. 7A, the second electrodes 720 and the crossover bridge 722 comprise a stack of layers including a portion of the bridged gapped conductor layer 732, a portion of a dielectric layer 734 and a portion of a second conductor layer 736. The projective capacitive touch sensor 700 may be fabricated according to the method 300 of circuit fabrication as described above. In particular, the bridged gapped conductor layer 732, the dielectric layer 734 and the second conductor layer 736 may be substantially similar to the first conductor layer 430, the dielectric layer 440 and the second conductor layer 420, respectively, of the multilayer circuit 400 illustrated in FIGS. 4A-4D that was fabricated according to the method 300 of multilevel mask circuit fabrication in FIG. 3, for example. Moreover, some of the gaps of an underlying portion of the bridge gapped conductor layer 732 under the second conductor 736 of the second electrodes 720 insure that the underlying portion of the bridged gapped conductor 732' is electrically isolated from a remainder of the bridged gapped conductor layer 732 of the first electrodes 710, according to various examples.

Figure 7B:
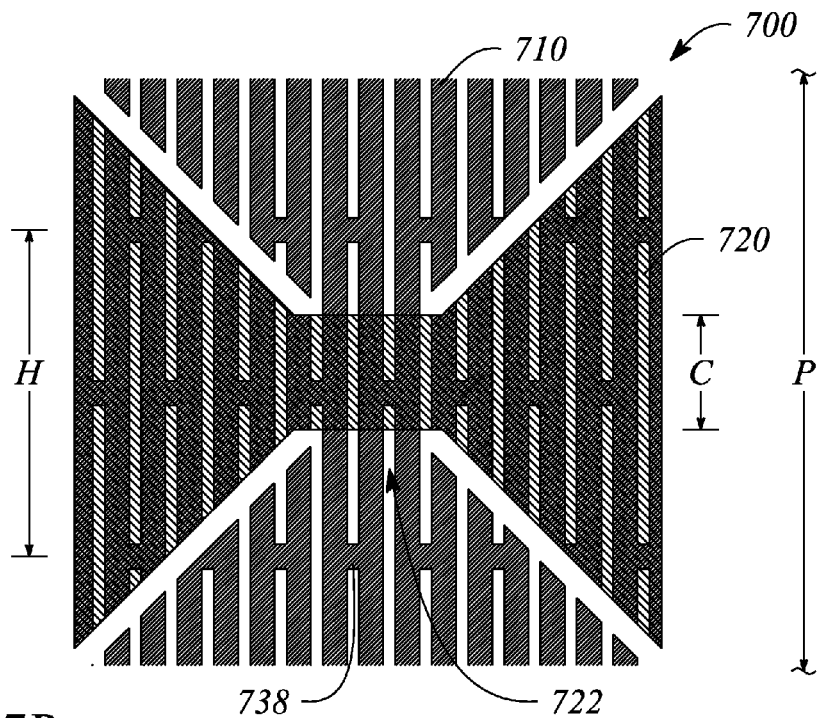
FIG. 7B illustrates a plan view of the portion of the projective capacitive touch sensor illustrated in FIG. 7A, according to an example consistent with the principles described herein.

FIG. 7B illustrates a plan view of the portion of the projective capacitive touch sensor 700 illustrated in FIG. 7A, according to an example consistent with the principles described herein. For example, a pitch H of periodic bridges 738 of the bridged gapped conductor layer 732 used to make the first electrodes 710 may be defined as a center-to-center spacing between bridges 738 on a common side of a trace within the bridged gapped conductor layer 732. Further, a width of the crossover bridge 722 between the second electrodes 720 may be defined as C, as illustrated in FIG. 7B. If the pitch H is greater than about two times the connection width C, electrical isolation may be provided. For example, the pitch H may be three times the width C.

According to various examples, the pitch H of the periodic bridges may be less than about one half of the first electrode pitch P. A periodic bridge pitch H that is less than about one half the first electrode pitch P may provide substantial electrical connectivity within the first electrode, for example. In some examples, the periodic bridge pitch H is less than about one quarter of the first electrode pitch P. In some examples, the periodic bridge pitch H is much less than the electrode pitch P, but greater than about two times the connection width C. In some examples, the periodic bridge pitch H is chosen to be as small as is possible, but still sufficiently larger than the connection width C to provide electrical isolation.

According to some examples of the principles described herein, a circuit fabrication system is provided. The circuit fabrication system may be used to fabricate multilayer circuits such as, but not limited to, a projective capacitive touch sensor, for example sensor 600 or 700. In some examples, the circuit fabrication system may be used to fabricate circuits, e.g., multilayer circuit 200 according to the method 100 of circuit fabrication, described above. In some examples, the fabricated circuit may be a projective capacitive touch sensor fabricated entirely on a single side of a substrate.

Figure 8:
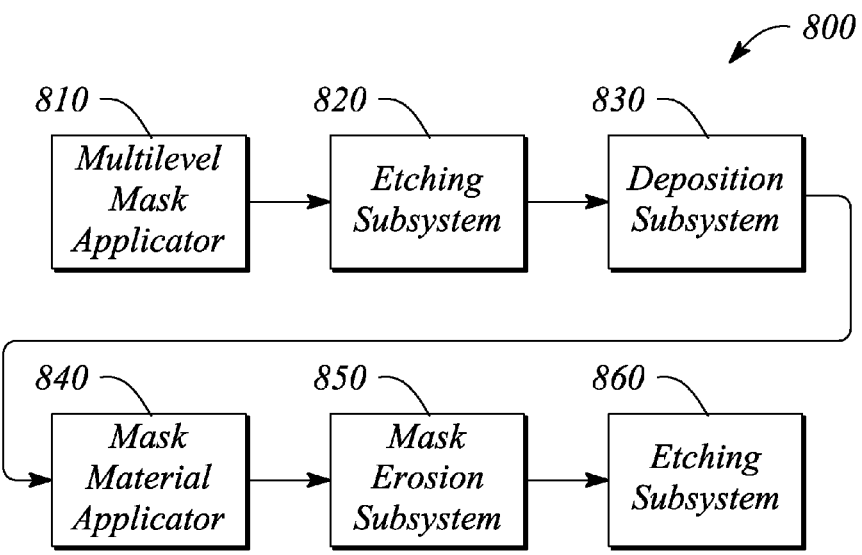
FIG. 8 illustrates a circuit fabrication system, according to an example consistent with the principles described herein.

FIG. 8 illustrates a circuit fabrication system 800, according to an example consistent with the principles described herein. As illustrated, the circuit fabrication system 800 comprises a multilevel mask applicator 810. The multilevel mask applicator 810 is configured to apply a multilevel mask to a material layer on a substrate, e.g., a first conductor layer. In some examples, the multilevel mask applicator 810 is used to apply 110 the multilevel mask 210 of the method 100 of circuit fabrication, described above. For simplicity of discussion, the circuit fabrication system 800 of FIG. 8 will be described below with reference to the method 100 of multilevel mask circuit fabrication and FIGS. 1 and 2A-2G.

In particular, the multilevel mask applied by the multilevel mask applicator 810 may expose a portion of the first conductor layer. The multilevel mask includes a first level that is thinner than a second level, as discussed above with respect to the method 100 of circuit fabrication. In some examples, the multilevel mask applicator 810 may be configured to employ imprint lithography to apply the multilevel mask. Imprint lithography may be configured to form the multilayer mask in situ, for example.

The circuit fabrication system 800 further comprises a first etching subsystem 820. The first etching subsystem 820 is configured to etch and remove a portion of the first conductor layer exposed by the multilevel mask. Further, the etching subsystem 820 is configured to provide undercutting at a periphery of the multilevel mask. According to some examples, the etching and undercutting provided by the first etching subsystem 820 may be substantially similar to etching 120 described above with respect to the method 100 of circuit fabrication.

The circuit fabrication system 800 further comprises a deposition subsystem 830. The deposition subsystem 830 is configured to deposit a second conductor layer over the multilevel mask and any exposed portions of the substrate. In some examples, deposition by the deposition subsystem 830 is substantially similar to depositing 130 a second conductor layer, described above with respect to method 100. In particular, the deposition subsystem 830 may deposit the second conductor layer as a substantially conformal coating over the multilevel mask.

The circuit fabrication system 800 further comprises a mask material applicator 840 configured to cover a surface of the second conductor layer with another mask material. According to some examples, covering of the second conductor surface with the other mask material is substantially similar to covering 142 a surface of the second conductor layer described above with respect to the method 100 of circuit fabrication. In particular, the other mask material used by the mask material applicator 840 may be in a liquid form, according to some examples. Further, the resultant other mask layer (e.g., other mask 240 in FIG. 2D) produced by the mask material applicator 840 may be substantially planar after being applied to cover the second conductor surface. Alternatively, the circuit fabrication system 800 further comprises a planarization subsystem (e.g., chemical polishing, mechanical polishing, or chemical mechanical polishing (CMP)) to achieve the substantially planar mask layer on the second conductor layer.

The circuit fabrication system 800 further comprises a mask erosion subsystem 850. The mask erosion subsystem 850 is configured to erode the other mask material covering the second conductor surface. In particular, the other mask material is eroded by the mask erosion subsystem 850 to expose a portion of the second conductor layer overlying the multilevel mask. In some examples, the exposed portion of the second conductor layer is a portion overlying the second level of the multilevel mask (see, for example FIG. 2E). In some examples, the mask erosion subsystem 850 comprises a plasma etch system. In some examples, the mask erosion subsystem 850 provides mask erosion that is substantially similar to eroding 144 the other mask, as described above with respect to the method 100 of circuit fabrication.

The circuit fabrication system 800 further comprises a second etching subsystem 860. The second etching subsystem 860 is configured to etch and remove the exposed portion of the second conductor layer, according to various examples. In some examples, the second etching subsystem 860 may provide etching and removal of the second conductor layer that is substantially similar to etching 146 in the method 100 of circuit fabrication, described above. In some examples, the first etching subsystem 820 is also the second etching subsystem 860 and is configured to perform etching and removal of the exposed portion of the second conductor layer in addition to the first conductor layer described above.

As mentioned above, the circuit fabrication system 800 may be used to fabricate a capacitive touch sensor, for example a projective capacitive touch sensor described above. In these examples, a portion of the second conductor layer deposited by the deposition subsystem 830 on the first level of the multilevel mask may be configured to form a crossover bridge above and isolated from a portion of the first conductor layer. The crossover bridge may be configured to interconnect a pair of second electrodes and to cross over an interconnection between a pair of first electrodes of the projective capacitive touch sensor, according to various examples.

Removal of the remaining multilevel mask provides for the crossover bridge (e.g., crossover bridge 260 of FIG. 2G) to float above the interconnection between the first electrode pair. For example, the projective capacitive touch sensor 600 illustrated in FIGS. 6A and 6B may be fabricated using the circuit fabrication system 800. Moreover, the projective capacitive touch sensor fabricated using the circuit fabrication system 800 may include a bridged gapped conductor of the first conductor layer, for example as illustrated in FIG. 5.

Thus, there have been described examples of a method of circuit fabrication, a circuit fabrication system and a projective capacitive touch sensor that employ a multilevel mask. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A method of multilevel mask circuit fabrication, the method comprising:
   patterning a first conductor layer of a multilayer circuit using a multilevel mask, the first conductor layer patterning to provide one of:
   electrical isolation between the first conductor layer and a second conductor layer that overlies the multilevel mask, the electrical isolation being provided by undercutting the multilevel mask; or
   electrical isolation between the first conductor layer and a second conductor layer that underlies the multilevel mask, the first conductor layer comprising a bridged gapped conductor having parallel, spaced apart traces separated by gaps between the traces, the gaps being periodically bridged to electrically connect adjacent parallel traces to one another, the electrical isolation being provided by both a spacing between patterned portions of the first and second conductor layers and an insulating layer between the second conductor layer that underlies the multilevel mask and the first conductor layer.

2. The method of multilevel mask circuit fabrication of claim 1, wherein the second conductor layer underlies the multilevel mask, and wherein patterning a first conductor layer comprises:
 applying the multilevel mask on the second conductor layer;
 etching through the multilevel mask to remove portions of the second conductor layer, the insulating layer and the first conductor layer exposed by the multilevel mask;
 eroding the multilevel mask to expose the second conductor layer underlying portions of the multilevel mask corresponding to a first level of the multilevel mask, a second level of the multilevel mask covering other portions of the second conductor layer after eroding; and
 etching to remove portions of the second conductor layer exposed by eroding the multilevel mask portions corresponding to the first level.

3. The method of multilevel mask circuit fabrication of claim 2, further comprising:
 depositing a conductive material on a substrate to form the first conductor layer;
 patterning the first conductor layer to form the bridged gapped conductor;
 depositing the insulating layer on the bridged gapped conductor of the first conductor layer; and
 depositing the second conductor layer on the deposited insulating layer, wherein depositing a conductive material, patterning the first conductor layer, depositing the insulating layer, and depositing the second conductor layer are performed prior to applying the multilevel mask on the second conductor layer.

4. The method of multilevel mask circuit fabrication of claim 1, wherein one or both of the first conductor layer and the second conductor layer comprises an optically transparent conductor material.

5. A method of multilevel mask circuit fabrication, the method comprising:
 patterning a first conductor layer of a multilayer circuit using a multilevel mask, wherein the using a multilayer mask comprises one of:
  provide electrical isolation between the first conductor layer and a second conductor layer that overlies the multilevel mask, the electrical isolation being provided by undercutting the multilevel mask; or
  provide electrical isolation between the first conductor layer and a second conductor layer that underlies the multilevel mask, the first conductor layer comprising a bridged gapped conductor, wherein the electrical isolation is provided by both the bridged gapped conductor and an insulating layer between the second conductor layer and the first conductor layer, wherein the second conductor layer overlies the multilevel mask;
 applying the multilevel mask on the first conductor layer, a portion of the first conductor layer being exposed by the multilevel mask;
 etching the exposed portion of the first conductor layer to remove the exposed portion and to further provide the undercutting of the first conductor layer at a periphery of the multilevel mask to pattern the first conductor layer;
 depositing the second conductor layer to cover the multilevel mask and a portion of a substrate exposed by the etching; and
 removing a portion of the second conductor layer overlying the multilevel mask.

6. The method of multilevel mask circuit fabrication of claim 5, wherein removing a portion of the second conductor layer overlying the multilevel mask comprises:
 covering a surface of the second conductor layer on the multilevel mask and the substrate with another mask material;
 eroding the other mask material to expose the portion of the second conductor layer overlying the multilevel mask; and
 etching to remove the exposed portion of the second conductor layer.

7. The method of multilevel mask circuit fabrication of claim 6, wherein the multilevel mask has a first level that is a thin region of the multilevel mask and a second level that is a relatively thicker region of the multilevel mask, the removed portion of the second conductor layer being a portion covering the second level, a portion of the second conductor layer deposited on the first level forming a crossover above and electrically isolated from a portion of the patterned first conductor layer.

8. The method of multilevel mask circuit fabrication of claim 6, wherein the first conductor layer comprises a bridged gapped conductor.

9. The method of multilevel mask circuit fabrication of claim 5, wherein the multilevel mask has a first level that is a thin region of the multilevel mask and a second level that is a relatively thicker region of the multilevel mask, the removed portion of the second conductor layer being a portion covering the second level, a portion of the second conductor layer deposited on the first level forming a crossover above and electrically isolated from a portion of the patterned first conductor layer.

10. The method of multilevel mask circuit fabrication of claim 9, wherein the first conductor layer comprises a bridged gapped conductor.

11. The method of multilevel mask circuit fabrication of claim 5, wherein the first conductor layer comprises a bridged gapped conductor.

12. A circuit fabrication system comprising:
 a multilevel mask applicator to apply a multilevel mask to a first conductor layer on a substrate;
 a first etching subsystem to etch and remove a portion of the first conductor layer exposed by the multilevel mask, the etching subsystem to provide undercutting at a periphery the multilevel mask;
 a deposition subsystem to deposit a second conductor layer over the multilevel mask; and
 a mask material applicator to cover a surface of the second conductor layer with another mask material;
 a mask erosion subsystem to erode the other mask material and expose a portion of the second conductor layer overlying the multilevel mask; and
 a second etching subsystem to remove the exposed portion of the second conductor layer.

13. The circuit fabrication system of claim 12, wherein the mask applicator is to employ imprint lithography to apply the multilayer mask, the imprint lithography to form the multilayer mask in situ on the first conductor layer.

14. The circuit fabrication system of claim 12, wherein the multilevel mask applied by the multilevel mask applicator has a first level that is a thin region of the multilevel mask and a second level that is a relatively thicker region of the multilevel mask, the mask erosion subsystem to erode the other mask material from the second level, the second etching subsystem to remove the second conductor layer from the second level, a portion of the second conductor layer deposited by the deposition subsystem on the first level to form a crossover bridge above and isolated from a portion of the first conductor layer.

15. The circuit fabrication system of claim 12, wherein the substrate is transparent and one or both of the first conductor layer and the second conductor layer comprise a transparent conductor material.

16. The circuit fabrication system of claim 12, wherein the first conductor layer on the substrate comprises a bridged gapped conductor.

17. The circuit fabrication system of claim 16, wherein the multilevel mask applied by the multilevel mask applicator has a first level that is a thin region of the multilevel mask and a second level that is a relatively thicker region of the multilevel mask, the mask erosion subsystem to erode the other mask material from the second level, the second etching subsystem to remove the second conductor layer from the second level, a portion of the second conductor layer deposited by the deposition subsystem on the first level to form a crossover bridge above and isolated from a portion of the first conductor layer.

18. The circuit fabrication system of claim 16, wherein the first conductor layer on the substrate comprises a bridged gapped conductor.

19. A multilayer circuit comprising:
  a first conductor layer comprising a patterned portion of a bridged gapped conductor having a plurality of traces separated by gaps, the gaps being periodically bridged to electrically connect adjacent parallel traces to one another;
  a second conductor layer adjacent the first conductor layer; and
  an insulating layer to electrically isolate a portion of the bridged gapped conductor of the first conductor layer from an overlying portion of the second conductor layer, wherein the insulating layer provides a spacing between the first conductor layer comprising a patterned portion of the bridged gapped conductor layer and the second conductor layer, such that the electrical isolation is provided by physically and electrically isolating the first conductor layer from the second conductor layer.

20. The multilayer circuit of claim 19, wherein the multilayer circuit is a projective capacitive touch sensor having a first electrode comprising a portion of the first conductor layer and a second electrode comprising a portion of the second conductor layer, one or more of the second conductor layer and/or the bridged gapped conductor of the first conductor layer comprising a transparent conductor material, and wherein a spacing of the periodic bridging of the gaps is less than a pitch of a plurality of electrodes comprising the first electrode.

* * * * *

UNITED STATES PATENT AND TRADEMARK OFFICE
CERTIFICATE OF CORRECTION

PATENT NO. : 9,583,387 B2  
APPLICATION NO. : 14/787223  
DATED : February 28, 2017  
INVENTOR(S) : Ping Mei et al.

Page 1 of 1

It is certified that error appears in the above-identified patent and that said Letters Patent is hereby corrected as shown below:

On the Title Page

In item (72), in Column 1, in "Inventors", Lines 1-2, delete "Carl A. Taussig" and insert -- Carl P. Taussig --, therefor.

In the Specification

In Column 5, Line 14, delete "back'," and insert -- 'back', --, therefor.

In Column 8, Line 39, delete "theses" and insert -- these --, therefor.

In Column 14, Line 57, delete "(CFO" and insert -- $(CF_4)$ --, therefor.

In Column 15, Line 7, delete "$H_2 0$)" and insert -- $H_2O$) --, therefor.

In Column 18, Line 38, delete "His" and insert -- H is --, therefor.

In Column 18, Line 47, delete "His" and insert -- H is --, therefor.

In Column 18, Line 48, delete "His" and insert -- H is --, therefor.

Signed and Sealed this  
Thirteenth Day of June, 2017

Joseph Matal  
*Performing the Functions and Duties of the*  
*Under Secretary of Commerce for Intellectual Property and*  
*Director of the United States Patent and Trademark Office*